United States Patent
Fujiwara et al.

(10) Patent No.: US 7,943,964 B2
(45) Date of Patent: May 17, 2011

(54) $Al_xGa_yIn_{1-x-y}N$ CRYSTAL SUBSTRATE, SEMICONDUCTOR DEVICE, AND METHOD OF MANUFACTURING THE SAME

(75) Inventors: Shinsuke Fujiwara, Itami (JP); Tomoki Uemura, Itami (JP); Takuji Okahisa, Itami (JP); Koji Uematsu, Itami (JP); Manabu Okui, Itami (JP); Muneyuki Nishioka, Itami (JP); Shin Hashimoto, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 370 days.

(21) Appl. No.: 12/096,986

(22) PCT Filed: Oct. 16, 2006

(86) PCT No.: PCT/JP2006/320549
§ 371 (c)(1),
(2), (4) Date: Jun. 11, 2008

(87) PCT Pub. No.: WO2007/069388
PCT Pub. Date: Jun. 21, 2007

(65) Prior Publication Data
US 2009/0194847 A1 Aug. 6, 2009

(30) Foreign Application Priority Data
Dec. 14, 2005 (JP) .................. 2005-360621

(51) Int. Cl.
*H01L 33/30* (2010.01)

(52) U.S. Cl. .......... 257/200; 257/189; 257/11; 257/201; 257/615; 257/E33.025; 257/E33.023; 257/E33.049; 257/E31.019; 257/E31.059; 257/E27.012; 257/E29.089; 257/E29.1

(58) Field of Classification Search ........................ None
See application file for complete search history.

(56) References Cited

U.S. PATENT DOCUMENTS
5,668,395 A    9/1997 Razeghi

U.S. PATENT DOCUMENTS
7,687,827 B2 *  3/2010 Piner et al. ............ 257/189
2004/0089919 A1  5/2004 Motoki et al.
2005/0103257 A1 * 5/2005 Xu et al. ................ 117/84

FOREIGN PATENT DOCUMENTS
| EP | 1 304 749 | 4/2003 |
| JP | 57-120343 | 7/1982 |
| JP | 2000-188285 | 7/2000 |
| JP | 2001-102307 | 4/2001 |
| JP | 2007-214547 A * | 8/2007 |
| RU | 2 187 172 | 8/2002 |

OTHER PUBLICATIONS

Motoki et al "Preparation of Large Freestanding GaN Substrates by Hydride Vapor Phase Epitaxy Using GaAs as a Starting Substrate" Japanese Journal of Applied Physics 40 (2001): L140-L143.*
Xueping Xu et al., "Growth and Characterization of Low Defect GaN by Hydride Vapor Phase Epitaxy", Journal of Crystal Growth, 2002, pp. 223-229, vol. 246.
* cited by examiner

*Primary Examiner* — Minh-Loan T Tran
*Assistant Examiner* — Fei Fei Yeung Lopez
(74) *Attorney, Agent, or Firm* — Drinker Biddle & Reath LLP

(57) ABSTRACT

An $Al_xGa_yIn_{1-x-y}N$ crystal substrate of the present invention has a main plane having an area of at least 10 cm². The main plane has an outer region located within 5 mm from an outer periphery of the main plane, and an inner region corresponding to a region other than the outer region. The inner region has a total dislocation density of at least $1\times10^2$ cm⁻² and at most $1\times10^6$ cm⁻². It is thereby possible to provide an $Al_xGa_yIn_{1-x-y}N$ crystal substrate having a large size and a suitable dislocation density for serving as a substrate for a semiconductor device, a semiconductor device including the $Al_xGa_yIn_{1-x-y}N$ crystal substrate, and a method of manufacturing the same.

8 Claims, 4 Drawing Sheets

$Al_xGa_yIn_{1-x-y}N$ CRYSTAL SUBSTRATE, SEMICONDUCTOR DEVICE, AND METHOD OF MANUFACTURING THE SAME

TECHNICAL FIELD

The present invention relates to an $Al_xGa_yIn_{1-x-y}N$ crystal substrate (where x and y are numeric values satisfying $0 \leq x$, $0 \leq y$, and $x+y \leq 1$, the same applies to the following) having a dislocation density for preferably being used as a substrate for various semiconductor devices such as light-emitting elements, electronic elements, and semiconductor sensors, a semiconductor device including the $Al_xGa_yIn_{1-x-y}N$ crystal substrate, and a method of manufacturing the same.

BACKGROUND ART

Group III nitride crystal substrates such as $Al_xGa_yIn_{1-x-y}N$ crystal substrates are significantly useful as substrates for various semiconductor devices such as light-emitting elements, electronic elements, and semiconductor sensors. Here, in order to improve properties of the various semiconductor devices, there is a demand for $Al_xGa_yIn_{1-x-y}N$ crystal substrates each having a low dislocation density and favorable crystallinity. Further, from a viewpoint of utilization efficiency of the $Al_xGa_yIn_{1-x-y}N$ crystal substrates, a main plane of each of the substrates is required to have an area of at least $10\ cm^{-2}$, preferably at least $20\ cm^{-2}$.

Therefore, to fabricate the $Al_xGa_yIn_{1-x-y}N$ crystal substrates each having a large size and a low dislocation density, various methods have been proposed in X. Xu and five others, "Growth and characterization of low defect GaN by hydride vapor phase epitaxy" J. Crystal Growth, 246, (2002), p 223-229 (hereinafter referred to as Non-Patent Document 1), Japanese Patent Laying-Open No. 2001-102307 (hereinafter referred to as Patent Document 1), and others.

Non-Patent Document 1 discloses that in growth of a GaN crystal, for example, a dislocation density of the GaN crystal is decreased as a thickness of the grown crystal is increased. However, in such a method of decreasing a dislocation density by increasing the thickness to be grown, even if a GaN crystal is grown to have a thickness of 3 mm, it is difficult to decrease the dislocation density to $1 \times 10^6\ cm^{-2}$ or lower, and hence only a small effect of reducing dislocations is obtained. Furthermore, in such a method of decreasing a dislocation density, variations in dislocation density in a substrate plane also cause variations in dislocation density of a GaN crystal, and hence a region having a high dislocation density may remain in the GaN crystal.

Patent Document 1 discloses a method of forming multiple pits each having a minute inclined plane, on a crystal growth plane, in growing a GaN crystal, and causing dislocations to occur intensively in these pits to thereby reduce dislocations in a region other than the pits. However, in such a method of decreasing a dislocation density, multiple pit regions each having a high dislocation density remain in a Group III nitride crystal.

Therefore, an $Al_xGa_yIn_{1-x-y}N$ crystal substrate having a large size and a low dislocation density and suitably used for semiconductor devices has not yet been heretofore obtained.
Patent Document 1: Japanese Patent Laying-Open No. 2001-102307
Non-Patent Document 1: X. Xu and five others, "Growth and characterization of low defect GaN by hydride vapor phase epitaxy", J. Crystal Growth, 246, (2002), p 223-229

DISCLOSURE OF THE INVENTION

Problems to be Solved by the Invention

As a method of growing an $Al_xGa_yIn_{1-x-y}N$ crystal for solving the above-described problems and obtaining an $Al_xGa_yIn_{1-x-y}N$ crystal substrate having a large size and a low dislocation density, we proposed a crystal growth method characterized in that in growth of an $Al_xGa_yIn_{1-x-y}N$ crystal, at least some of dislocations remaining in the $Al_xGa_yIn_{1-x-y}N$ crystal are propagated in a direction substantially parallel to a crystal growth plane of the $Al_xGa_yIn_{1-x-y}N$ crystal so as to be released to an outer periphery of the $Al_xGa_yIn_{1-x-y}N$ crystal (e.g. see Patent Application No. 2005-316956.). Accordingly, there was obtained an ability to grow an $Al_xGa_yIn_{1-x-y}N$ crystal having a dislocation density of at most $1 \times 10^6\ cm^{-2}$, or at most $1 \times 10^2\ cm^{-2}$ depending on a condition, even in the case of a large-sized crystal having a main plane of at least $10\ cm^2$, without allowing regions having a high dislocation density to remain.

Conventionally, there has been a belief that properties of a semiconductor device including an $Al_xGa_yIn_{1-x-y}N$ crystal substrate are improved as a dislocation density of this substrate is decreased. However, when a property, for example, a withstand voltage (a voltage that causes a breakdown phenomenon of the semiconductor device, namely, a phenomenon of a drastic increase in current in a reverse direction; the same applies to the following) of a semiconductor device obtained by forming an at least one-layered semiconductor layer on the $Al_xGa_yIn_{1-x-y}N$ crystal substrate obtained as such and having a low dislocation density was measured, it was found that an excessively low dislocation density of the substrate also lowers a withstand voltage of the semiconductor device.

Therefore, inventors of the present invention fabricated semiconductor devices including $Al_xGa_yIn_{1-x-y}N$ crystal substrates, respectively, which were obtained by the above-described crystal growth method and each of which had a dislocation density that fell within a range of $45\ cm^{-2}$–$3.2 \times 10^6\ cm^{-2}$, and measured withstand voltages of the semiconductor devices. They thereby found a range of the dislocation density of the $Al_xGa_yIn_{1-x-y}N$ crystal substrate for suitably being used for a semiconductor device, and has thus accomplished the present invention.

In other words, an object of the present invention is to propose an $Al_xGa_yIn_{1-x-y}N$ crystal substrate having a large size and a suitable dislocation density for serving as a substrate for a semiconductor device, a semiconductor device including the $Al_xGa_yIn_{1-x-y}N$ crystal substrate, and a method of manufacturing the same.

Means for Solving the Problems

The present invention is an $Al_xGa_yIn_{1-x-y}N$ crystal substrate ($0 \leq x$, $0 \leq y$, $x+y \leq 1$) which has a main plane having an area of at least $10\ cm^2$. The main plane has an outer region located within 5 mm from an outer periphery of the main plane, and an inner region corresponding to a region other than the outer region. The inner region has a total dislocation density of at least $1 \times 10^2\ cm^{-2}$ and at most $1 \times 10^6\ cm^{-2}$.

In the $Al_xGa_yIn_{1-x-y}N$ crystal substrate according to the present invention, the total dislocation density can be set to at least $2 \times 10^2\ cm^{-2}$ and at most $1 \times 10^5\ cm^{-2}$. Furthermore, a screw dislocation density in the total dislocation density can be set to at most $1 \times 10^4\ cm^{-2}$. Furthermore, the $Al_xGa_yIn_{1-x-y}N$ crystal substrate according to the present invention can have n-type conductivity and have specific resistance of at most 1

$\Omega \cdot cm^{-2}$. Furthermore, crystal growth of the $Al_xGa_yIn_{1-x-y}N$ crystal substrate according to the present invention can be performed by an HVPE method.

Furthermore, the present invention is a semiconductor device including: an $Al_xGa_yIn_{1-x-y}N$ crystal substrate ($0 \leq x$, $0 \leq y$, $x+y \leq 1$); and an at least one-layered semiconductor layer formed on the $Al_xGa_yIn_{1-x-y}N$ crystal substrate. The substrate has a main plane having an area of at least 10 cm². The main plane has an outer region located within 5 mm from an outer periphery of the main plane, and an inner region corresponding to a region other than the outer region. The inner region has a total dislocation density of at least $1 \times 10^2$ cm$^{-2}$ and at most $1 \times 10^6$ cm$^{-2}$. Furthermore, in the semiconductor device according to the present invention, the total dislocation density can be set to at least $2 \times 10^2$ cm$^{-2}$ and at most $1 \times 10^5$ cm$^{-2}$. Furthermore, a screw dislocation density in the total dislocation density can be set to at most $1 \times 10^4$ cm$^{-2}$.

Furthermore, the present invention is a method of manufacturing a semiconductor device, including the steps of: preparing an $Al_xGa_yIn_{1-x-y}N$ crystal substrate ($0 \leq x$, $0 \leq y$, $x+y \leq 1$); and growing an at least one-layered semiconductor layer on the substrate. The substrate has a main plane having an area of at least 10 cm². The main plane has an outer region located within 5 mm from an outer periphery of the main plane, and an inner region corresponding to a region other than the outer region. The inner region has a total dislocation density of at least $1 \times 10^2$ cm$^{-2}$ and at most $1 \times 10^6$ cm$^{-2}$. Furthermore, in the method of manufacturing the semiconductor device according to the present invention, the total dislocation density can be set to at least $2 \times 10^2$ cm$^{-2}$ and at most $1 \times 10^5$ cm$^{-2}$. Furthermore, a screw dislocation density in the total dislocation density can be set to at most $1 \times 10^4$ cm$^{-2}$.

Effects of the Invention

According to the present invention, it is possible to provide an $Al_xGa_yIn_{1-x-y}N$ crystal substrate having a large size and a suitable dislocation density for serving as a substrate for a semiconductor device, a semiconductor device including the $Al_xGa_yIn_{1-x-y}N$ crystal substrate, and a method of manufacturing the same.

DESCRIPTION OF THE REFERENCE SIGNS

10: base substrate, 10m, 12m: main plane, 10p: apex, 10s: (0001) plane, 11: $Al_xGa_yIn_{1-x-y}N$ crystal, 11a, 11b, 11c, 11s: crystal growth plane, 11d: dislocation propagation line, 11r: crystal growth starting plane, 11t: macro step plane, 11v, 12v: outer periphery, 12, 12a, 12b, 12c, 12d, 12e: $Al_xGa_yIn_{1-x-y}N$ crystal substrate, 12n: inner region, 12w: outer region, 21: HCl gas, 22: gallium, 23: gallium chloride gas, 26: nitrogen source gas, 29: doping gas, 40: semiconductor device, 41: semiconductor layer, 42: Schottky electrode, 43: ohmic electrode, 101m, 102m, 103m: partial plane, 200: HVPE apparatus, 201: reaction chamber, 202: substrate holder, 203: gallium chloride synthesis chamber, 204: gallium boat, 205: HCl gas conduit, 206: nitrogen source gas conduit, 207: exhaust pipe, 208, 209, 210: heater, R: radius, T: thickness, θ: inclined angle, φ: dislocation propagation angle.

BEST MODES FOR CARRYING OUT THE INVENTION

First Embodiment

Figure 1:
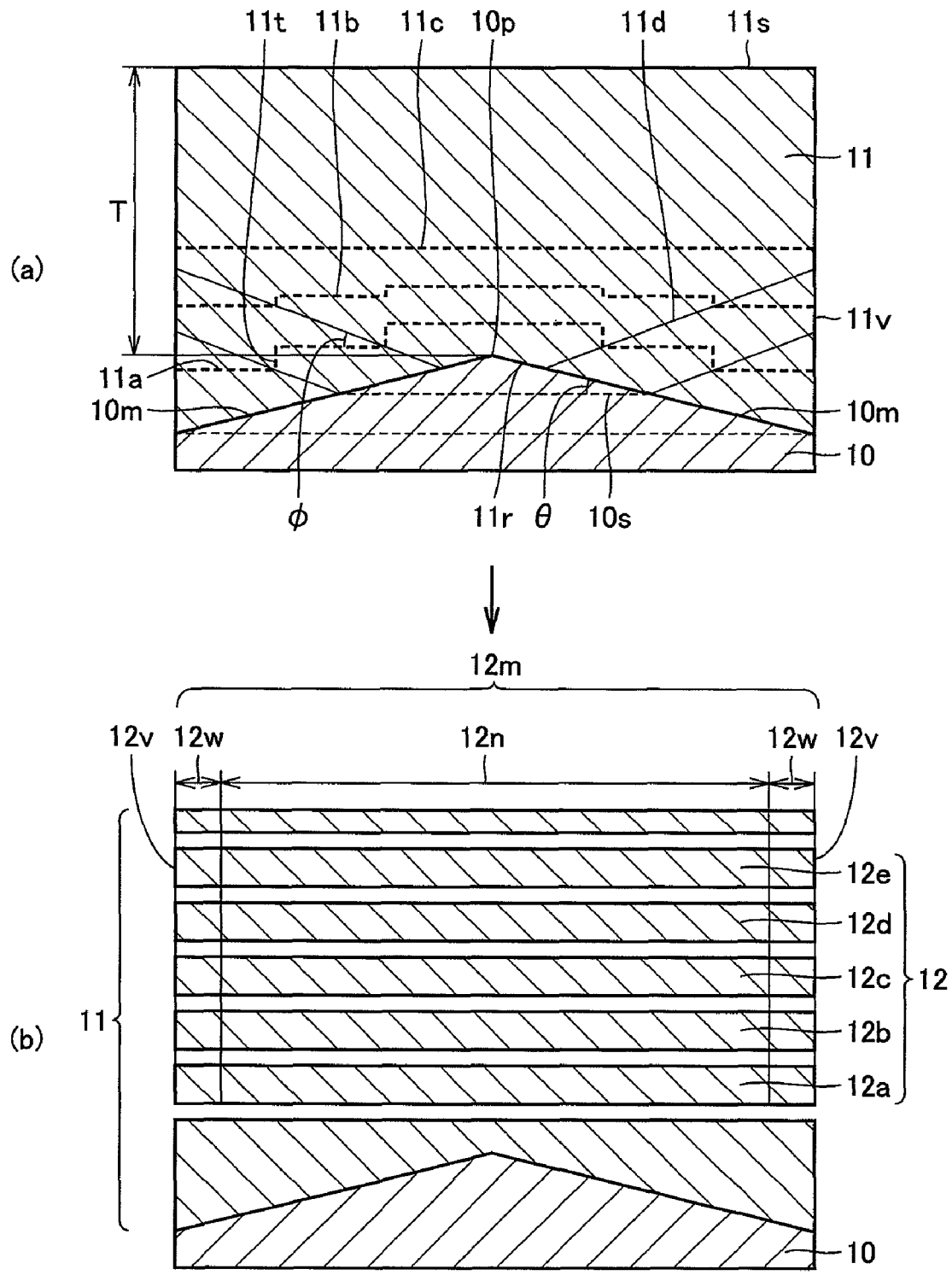
FIG. 1 is a schematic cross-sectional view showing an embodiment of an $Al_xGa_yIn_{1-x-y}N$ crystal substrate and a method of manufacturing the same, according to the present invention. Here, (a) shows a growing process of an $Al_xGa_yIn_{1-x-y}N$ crystal, while (b) shows a process of manufacturing the $Al_xGa_yIn_{1-x-y}N$ crystal substrate.

With reference to FIG. 1, an embodiment of an $Al_xGa_yIn_{1-x-y}N$ crystal substrate 12 according to the present invention is a large-sized substrate that has a main plane 12m having an area of at least 10 cm². Main plane 12m has an outer region 12w located within 5 mm from an outer periphery 12v, and an inner region 12n corresponding to a region other than the outer region. Inner region 12n has a total dislocation density of at least $1 \times 10^2$ cm$^{-2}$ and at most $1 \times 10^6$ cm$^{-2}$.

$Al_xGa_yIn_{1-x-y}N$ crystal substrate 12 according to the present embodiment has main plane 12m having an area of at least 10 cm², and hence can be applied to a wide variety of semiconductor devices and has high utilization efficiency.

Furthermore, $Al_xGa_yIn_{1-x-y}N$ crystal substrate 12 according to the present embodiment has inner region 12n having a total dislocation density of at least $1 \times 10^2$ cm$^{-2}$ and at most $1 \times 10^6$ cm$^{-2}$, and hence properties of a semiconductor device obtained by growing an at least one-layered semiconductor layer on substrate 12 are improved. Here, a region where a total dislocation density is evaluated is set to inner region 12 corresponding to a region other than outer region 12w because dislocations tend to remain in the outer region, and if a semiconductor device is fabricated in the inner region corresponding to a region other than the outer region having a high dislocation density, the effect thereof can be ignored. It is of course more preferable that the outer region also has fewer dislocations.

Examples of dislocations that can be exhibited in a substrate include a screw dislocation, an edge dislocation, and a mixed dislocation including the screw dislocation and the edge dislocation in a mixed manner. A dislocation that appears in a substrate can be observed as a pit generated by etching the substrate. Although an etchant is not particularly limited, a mixed melt of KOH and NaOH, having a liquid temperature of approximately 300-500° C. (hereinafter referred to as a KOH—NaOH mixed melt), or a mixed liquid of phosphoric acid and sulfuric acid, having a liquid temperature of approximately 200-300° C. (hereinafter referred to as a phosphoric acid-sulfuric acid mixed liquid), is preferably used. The dislocation density can be calculated by counting the number of pits per unit area.

When the substrate is etched, a dislocation site appears as a pit, and according to the size of the pit, the types of dislocation can be identified. A large pit (hereinafter referred to as an L pit) is derived from a screw dislocation, while a small pit (hereinafter referred to as an S pit) is derived from an edge dislocation. An intermediate-sized pit (hereinafter referred to as an I pit) is derived from a mixed dislocation. An absolute value of the size of each pit varies depending on a condition for etching a substrate. However, a ratio of relative sizes of the L pit, the I pit, and the S pit is approximately constant without depending on an etching condition. A ratio of (an L pit diameter): (an I pit diameter): (an S pit diameter) is approximately 10:2:1.

In the present application, the dislocation refers to any of the above-described screw dislocation, edge dislocation, and mixed dislocation, and total dislocations refer to all the dislocations including the above-described screw dislocation, edge dislocation, and mixed dislocation. Therefore, the total dislocation density is the number of total dislocations per unit area, namely, a sum of the numbers of screw dislocations, edge dislocations, and mixed dislocations per unit area, and is calculated by counting the total numbers of L pits, I pits, and S pits per unit area. In other words, the total dislocation density is a sum of a screw dislocation density, an edge dislocation density, and a mixed dislocation density. The screw pit density is the number of screw dislocations per unit area, and is calculated by counting the number of L pits per unit area.

Conventionally, there has been a belief that properties of a semiconductor device including a substrate are improved as a dislocation density of the substrate is decreased. However, if a total dislocation density of the substrate becomes an ultralow dislocation density of less than $1 \times 10^2$ cm$^{-2}$, properties of the semiconductor device are degraded instead. Although the reason thereof is not elucidated clearly at present, an inference is made as follows. Specifically, a dislocation has a function of an opening (also referred to as a getter; the same applies to the following) for drawing in precipitates generated owing to impurities or variations in composition of the substrate, and if the number of such dislocations is excessively decreased, generation of the above-described precipitates cannot be suppressed, causing degradation in crystallinity of the substrate.

If the total dislocation density of the substrate exceeds $1 \times 10^6$ cm$^{-2}$, dislocations of the crystal are increased and crystallinity is lowered, resulting in degradation of properties of the semiconductor device. Therefore, a total dislocation density of the substrate that improves properties of the semiconductor device is at least $1 \times 10^2$ cm$^{-2}$ and at most $1 \times 10^6$ cm$^{-2}$. From the above-described viewpoint, the total dislocation density of the substrate is preferably at least $2 \times 10^2$ cm$^{-2}$ and at most $1 \times 10^5$ cm$^{-2}$.

As to the screw dislocation density in the total dislocation density of the $Al_xGa_yIn_{1-x-y}N$ crystal substrate in the present embodiment, the screw dislocation density of the inner region is preferably at most $1 \times 10^4$ cm$^{-2}$ from a viewpoint of improving properties of a semiconductor device including the substrate. In other words, as long as the total dislocation density is at least $1 \times 10^2$ cm$^{-2}$ and at most $1 \times 10^6$ cm$^{-2}$, a lower screw dislocation density is more preferable, and a screw dislocation density of 0 cm$^{-2}$ may also be possible.

The degradation in properties of the semiconductor device caused by decreasing the total dislocation density of the $Al_xGa_yIn_{1-x-y}N$ crystal substrate in the present embodiment to less than $1 \times 10^2$ cm$^{-2}$, becomes significant as the substrate has higher conductivity. In contrast, if the $Al_xGa_yIn_{1-x-y}N$ crystal substrate has n-type conductivity and has specific resistance of at most 1 Ω·cm, an effect of improving properties of the semiconductor device by setting the total dislocation density of the substrate to at least $1 \times 10^2$ cm$^{-2}$ and at most $1 \times 10^6$ cm$^{-2}$ is remarkably exhibited.

Crystal growth of the $Al_xGa_yIn_{1-x-y}N$ crystal substrate in the present embodiment is preferably performed by an HVPE method, from a viewpoint of easily obtaining a thick crystal and increasing a yield of the substrate.

A large-sized $Al_xGa_yIn_{1-x-y}N$ crystal substrate which has a main plane having an area of at least 10 cm$^2$ and has an inner region having a total dislocation density of at least $1 \times 10^2$ cm$^{-2}$ and at most $1 \times 10^6$ cm$^{-2}$, as shown in the present embodiment, can be fabricated as follows.

Initially, with reference to FIG. 1(a), an $Al_xGa_yIn_{1-x-y}N$ crystal is grown, for example, as described below. There are included the steps of preparing, as a base substrate 10, an inclined substrate which has a main plane 10m having an inclined angle θ of at least 0.5° and at most 10° with respect to crystal growth planes 11a, 11b, 11c, and 11s of an $Al_xGa_yIn_{1-x-y}N$ crystal 11, and growing $Al_xGa_yIn_{1-x-y}N$ crystal 11 on main plane 10m of the inclined substrate. Accordingly, when $Al_xGa_yIn_{1-x-y}N$ crystal 11 is grown, at least some of dislocations inherited from main plane 10m of base substrate 10 and remaining in $Al_xGa_yIn_{1-x-y}N$ crystal 11 are propagated in a direction substantially parallel to crystal growth planes 11a, 11b, 11c, and 11s of $Al_xGa_yIn_{1-x-y}N$ crystal 11 (FIG. 1 shows a path along which the dislocations are propagated, as a dislocation propagation line 11d.) and released to an outer periphery 11v of $Al_xGa_yIn_{1-x-y}N$ crystal 11, so that a total dislocation density is adjusted to at least $1 \times 10^2$ cm$^{-2}$ and at most $1 \times 10^6$ cm$^{-2}$. Note that in FIG. 1(a), crystal growth planes 11a, 11b and 11c represent crystal growth planes during crystal growth, and crystal growth plane 11s represents a crystal growth plane after crystal growth.

In other words, with reference to FIG. 1(a), the present invention is as follows. $Al_xGa_yIn_{1-x-y}N$ crystal 11 is grown on the inclined substrate which has main plane 10m having inclined angle θ of at least 0.5° and at most 10° with respect to crystal growth planes 11a, 11b, 11c, and 11s of $Al_xGa_yIn_{1-x-y}N$ crystal 11. During the growth, a macro step plane 11t substantially perpendicular to crystal growth planes 11a and 11b is formed on crystal growth planes 11a and 11b, a crystal of which is being grown. As the crystal is grown, macro step plane 11t moves to outer periphery 11v of the crystal and disappears. It was found that the dislocations in the crystal propagate in a direction substantially parallel to crystal growth planes 11a and 11b and substantially perpendicular to macro step plane 11t, and are released to an outside of the crystal as macro step plane 11t moves to outer periphery 11v of the crystal. This phenomenon is applied to a method of growing $Al_xGa_yIn_{1-x-y}N$ crystal 11, so that it is possible to grow $Al_xGa_yIn_{1-x-y}N$ crystal 11 having a total dislocation density of at least $1 \times 10^2$ cm$^{-2}$ and at most $1 \times 10^6$ cm$^{-2}$ without allowing a region having a high total dislocation density to remain in the crystal.

Here, if inclined angle θ is less than 0.5°, the macro step plane is less likely to be formed, and propagation of the dislocations in the direction substantially perpendicular to the macro step plane becomes difficult. If inclined angle θ exceeds 10°, a stable crystal growth plane is less likely to be formed, and propagation of the dislocations in the direction substantially parallel to the crystal growth plane becomes difficult. In view of the foregoing, inclined angle θ is preferably larger than 2° and smaller than 8°.

During crystal growth, the crystal growth plane is parallel-translated in the direction of its normal as the crystal grows, as shown by crystal growth plane 11a, crystal growth plane 11b, crystal growth plane 11c, and crystal growth plane 11s, while causing macro step plane 11t to gradually disappear, as described above. Therefore, a direction of dislocation propagation line 11d (which refers to a line showing a path along which dislocations are propagated; the same applies to the following) has a certain dislocation propagation angle $\phi$ with respect to a crystal growth plane arbitrarily specified. Such dislocation propagation angle $\phi$ is determined by a dislocation propagation rate and a crystal growth rate. The dislocation propagation angle becomes smaller as the dislocation propagation rate becomes high with respect to the crystal growth rate. In such a method of growing $Al_xGa_yIn_{1-x-y}N$ crystal 11, the dislocation propagation rate is approximately equal to a moving rate of the macro step plane, and the moving rate of such a step plane becomes at least 5 times, and furthermore, at least 10 times as high as the crystal growth rate (i.e. the moving rate of the crystal growth plane) depending on a crystal growth condition. Consequently, the above-described dislocation propagation angle is at most 11°, and furthermore, at most 5.5°.

Accordingly, in the present application, "the direction substantially parallel to the crystal growth plane" means "a direction along an inclined angle falling within a range of 0°-11° with respect to the crystal growth plane", and "the direction substantially perpendicular to the macro step plane" means "a direction along an inclined angle falling within a range of 79°-90° with respect to the macro step plane".

As to the above-described inclined substrate (base substrate 10), it is preferable to use an $Al_pGa_qIn_{1-p-q}N$ substrate ($0 \leq p$, $0 \leq q$, $p+q \leq 1$; the same applies to the following) from a viewpoint of lattice continuity between the inclined substrate and $Al_xGa_yIn_{1-x-y}N$ crystal 11 to be grown. Here, x and p may be the same numeric value or different numeric values, and y and q may be the same numeric value or different numeric values. However, a combination that achieves lattice continuity is of course preferable. Here, if x and p are the same numeric value and y and q are the same numeric value, lattice continuity is of course obtained. However, even a combination in which at least one of a pair of x and p and a pair of y and q is different numeric values also achieves lattice continuity, and hence such a combination may be used. Furthermore, from a viewpoint of obtaining a crystal having favorable crystallinity at a high growth rate, it is preferable to grow a (0001) plane as the crystal growth plane of $Al_xGa_yIn_{1-x-y}N$ crystal 11 to be grown.

With reference to FIG. 1(b), $Al_xGa_yIn_{1-x-y}N$ crystal 11 obtained as described above is cut into flat planes, and their main planes are polished, so that at least one $Al_xGa_yIn_{1-x-y}N$ crystal substrate 12 is formed.

Second Embodiment

Figure 4:
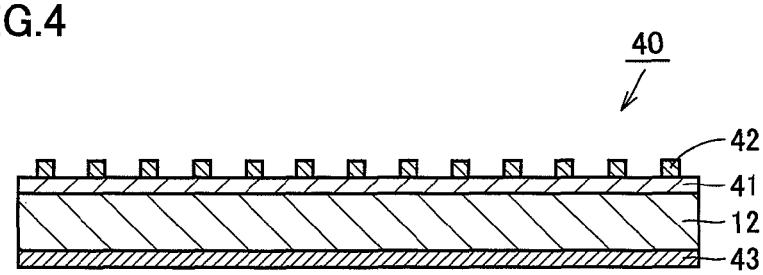
FIG. 4 is a schematic cross-sectional view showing an embodiment of a semiconductor device according to the present invention.

With reference to FIG. 4, an embodiment of a semiconductor device 40 according to the present invention is semiconductor device 40 including $Al_xGa_yIn_{1-x-y}N$ crystal substrate 12 and an at least one-layered semiconductor layer 41 formed thereon. Substrate 12 has main plane 12m having an area of at least 10 cm². Main plane 12m has outer region 12w located within 5 mm from its outer periphery and inner region 12n corresponding to a region other than the outer region. Inner region 12n has a total dislocation density of at least $1 \times 10^2$ $cm^{-2}$ and at most $1 \times 10^6$ $cm^{-2}$. The semiconductor device in the present embodiment includes the $Al_xGa_yIn_{1-x-y}N$ crystal substrate in the first embodiment, and hence has high properties.

Although such a semiconductor device is not particularly limited, examples thereof include light-emitting elements such as a light-emitting diode and a laser diode, electronic elements such as a rectifier, a bipolar transistor, a field-effect transistor, and an HEMT (High Electron Mobility Transistor), semiconductor sensors such as a temperature sensor, a pressure sensor, a radiation sensor, and a visible-ultraviolet light detector, an SAW (Surface Acoustic Wave) device, a vibrator, a resonator, an oscillator, an MEMS (Micro Electro Mechanical System) part, a voltage actuator, and others.

With reference to FIG. 4, a method of manufacturing a semiconductor device in the present embodiment includes the steps of preparing $Al_xGa_yIn_{1-x-y}N$ crystal substrate 12, and growing at least one-layered semiconductor layer 41 on substrate 12. Substrate 12 has main plane 12m having an area of at least 10 cm². Main plane 12m has outer region 12w located within 5 mm from its outer periphery, and inner region 12n corresponding to a region other than the outer region. Inner region 12n has a total dislocation density of at least $1 \times 10^2$ $cm^{-2}$ and at most $1 \times 10^6$ $cm^{-2}$. According to such a manufacturing method, it is possible to obtain a semiconductor device having high properties by growing at least one-layered semiconductor layer 41 on $Al_xGa_yIn_{1-x-y}N$ crystal substrate 12 in the first embodiment. Here, the step of preparing the $Al_xGa_yIn_{1-x-y}N$ crystal substrate may include the steps shown in the first embodiment, namely, as shown in FIG. 1(a), may include the steps of preparing a prescribed inclined substrate as base substrate 10, and growing $Al_xGa_yIn_{1-x-y}N$ crystal substrate 11 on main plane 10m of this inclined substrate, and as shown in FIG. 1(b), may include the steps of cutting $Al_xGa_yIn_{1-x-y}N$ crystal substrate 11 into flat planes, and polishing their main planes and forming $Al_xGa_yIn_{1-x-y}N$ crystal substrates 12.

First Example

Figure 2:
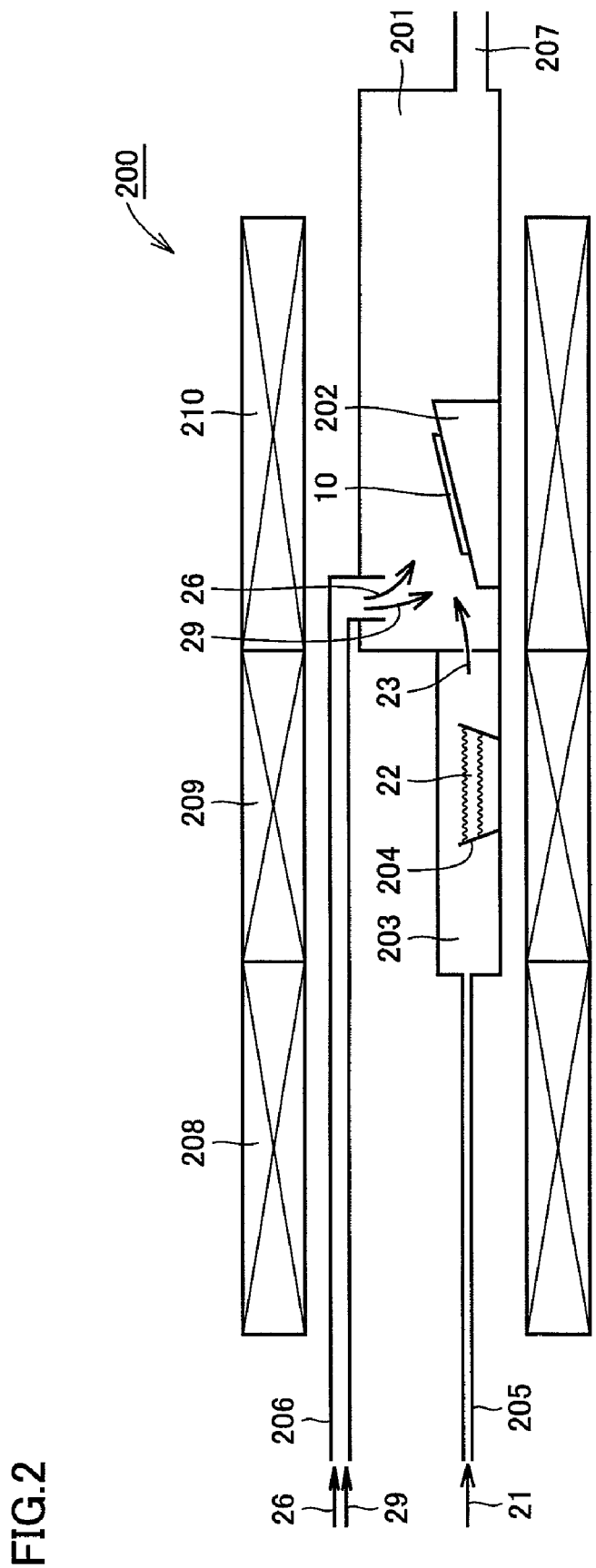
FIG. 2 is a schematic view showing an HVPE apparatus used for growing the $Al_xGa_yIn_{1-x-y}N$ crystal in the present invention.

A GaN crystal substrate identified as an $Al_xGa_yIn_{1-x-y}N$ crystal substrate was fabricated by an HVPE method. With reference to FIG. 2, in an HVPE apparatus 200 used in the present example, a substrate holder 202 for holding base substrate 10 is arranged in a reaction chamber 201, and there are installed a gallium chloride synthesis chamber 203 for synthesizing a gallium chloride gas 23 to be introduced into reaction chamber 201, an HCl gas conduit 205 for introducing an HCl gas 21 into gallium chloride synthesis chamber 203, a nitrogen source gas conduit 206 for introducing a nitrogen source gas 26 and if necessary, a doping gas 29, into reaction chamber 201, and an exhaust pipe 207 for exhausting reacted gases. Furthermore, a gallium boat 204 accommodating gallium (Ga) 22 is arranged in gallium chloride synthesis chamber 203. Furthermore, around gallium chloride synthesis chamber 203 and reaction chamber 201, there are installed heaters 208, 209 and 210 for heating HCl gas 21, nitrogen source gas 26, doping gas 29, gallium boat 204, base substrate 10, and others.

In HVPE apparatus 200 described above, gallium chloride gas 23 to be introduced into reaction chamber 201 is synthesized as follows. Specifically, gallium boat 204 arranged in gallium chloride synthesis chamber 203 is heated to 800° C. by heater 209, HCl gas 21 is introduced into gallium chloride synthesis chamber 203 through HCl gas conduit 205, and HCl gas 21 is made to react with gallium (Ga) 22 in gallium boat 204, to thereby synthesize a GaCl gas (gallium chloride gas 23). Here, HCl gas 21 is introduced into gallium chloride synthesis chamber 203, along with a carrier gas such as an $H_2$ gas.

The above-described GaCl gas (gallium chloride gas 23), an $NH_3$ gas (nitrogen source gas 26), and an $SiH_4$ gas (doping gas 29) were introduced into reaction chamber 201 along with an $H_2$ gas serving as a carrier gas. On the GaN substrate (base substrate 10) arranged on substrate holder 202 in reaction chamber 201 and heated to a substrate temperature of 1200° C., the GaCl gas (gallium chloride gas 23) was made to react with an $NH_3$ gas (nitrogen source gas 26) to grow a GaN crystal for 100 hours. As shown in FIG. 1(a), there is obtained a GaN crystal ($Al_xGa_yIn_{1-x-y}N$ crystal 11) doped with Si and having a thickness T of 5 mm from an apex 10p of base substrate 10.

When the GaN crystal was grown, in order to improve uniformity of an amount of each of the GaCl gas (gallium chloride gas 23) and the $NH_3$ gas (nitrogen source gas 26) supplied to the main plane of the GaN substrate, the GaN substrate (base substrate 10) was arranged on substrate holder 202 such that it was inclined 10° with respect to a horizontal plane, and rotated at a revolution speed of 60 revolutions/min. Furthermore, the partial pressure of the GaCl gas (gallium chloride gas 23) was set to 5.065 kPa (0.05 atm), the partial pressure of the $NH_3$ gas (nitrogen source gas 26) was set to 10.13 kPa (0.1 atm), and the partial pressure of the $SiH_4$ gas (doping gas 29) was set to 5.065 Pa (0.00005 atm).

Figure 3A:
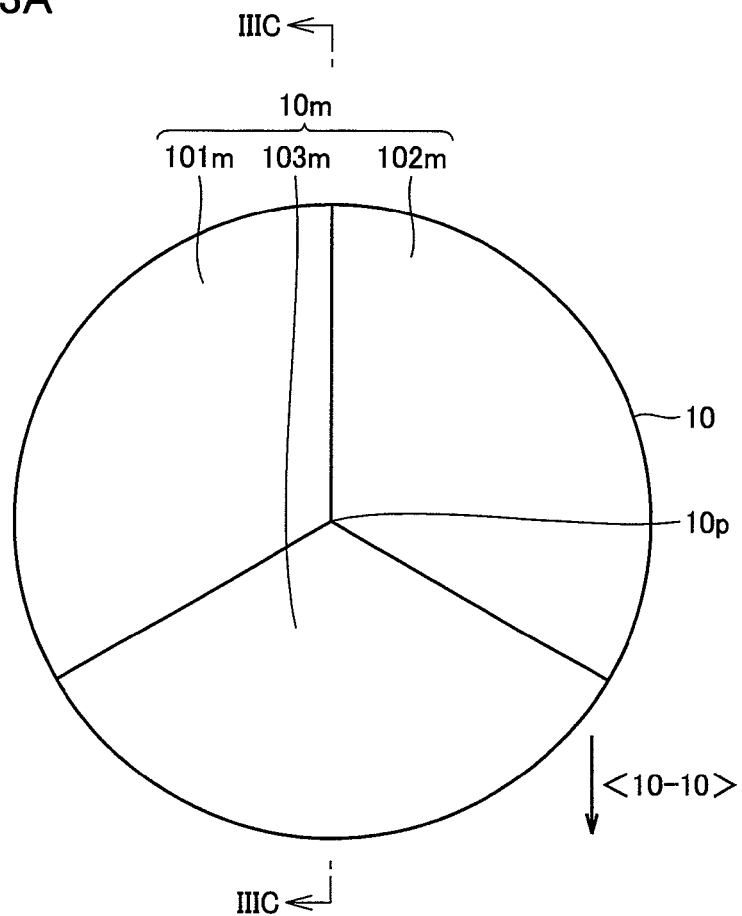
FIG. 3A is a schematic plan view showing a base substrate used for growing the $Al_xGa_yIn_{1-x-y}N$ crystal in the present invention.
Figure 3B:
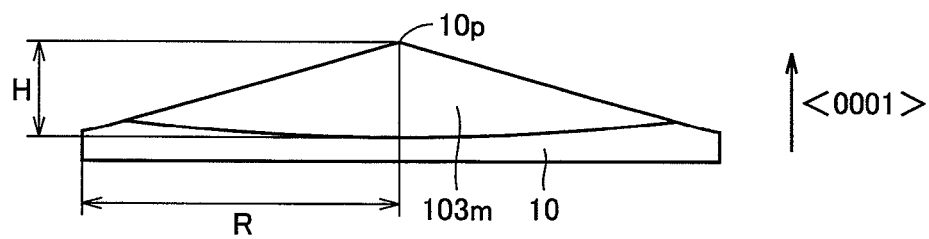
FIG. 3B is a schematic side view of the base substrate shown in FIG. 3A.
Figure 3C:
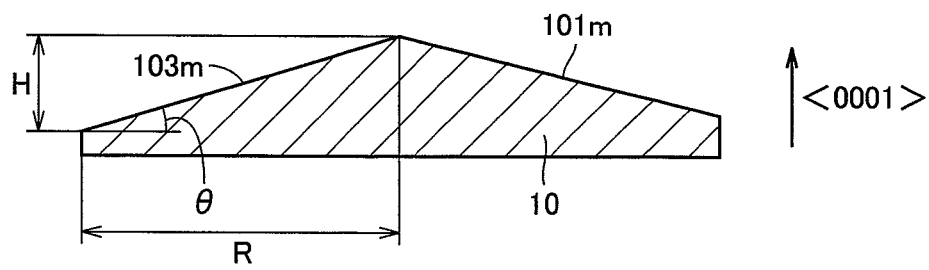
FIG. 3C is a schematic cross-sectional view of the base substrate shown in FIG. 3A taken along IIIC-IIIC.

Here, as base substrate 10, as shown in FIGS. 3A-3C, there were used five GaN substrates having different inclined heights H. Each of the five GaN substrates had main plane 10m where a crystal was to be grown, processed into a triangular pyramid shape having apex 11p and three partial planes 101m, 102m and 103m, and had a diameter of 5.08 cm (i.e. a radius of 2.54 cm). The GaN substrate having inclined height H of 1 mm is referred to as a base substrate I, the GaN substrate having an inclined height of 3 mm is referred to as a base substrate II, the GaN substrate having an inclined height of 5 mm is referred to as a base substrate III, the GaN substrate having an inclined height of 10 mm is referred to as a base substrate IV. The total dislocation density of these GaN substrates, which was calculated based on the number of pits formed by etching with a KOH—NaOH mixed melt at a liquid temperature of 350° C., was $5×10^6$ $cm^{-2}$. Note that arrows in FIGS. 3A, 3B and 3C show a <10-10> direction, a <0001> direction, and the <0001> direction, respectively. In base substrate 10, as is clear from FIGS. 3B and 3C, inclined angle θ, which is formed by each of partial planes 101m, 102m and 103m and the (0001) plane, inclined height H, and a radius R establish a relation of tan θ=H/R.

Next, as shown in FIG. 1(b), the GaN crystal ($Al_xGa_yIn_{1-x-y}N$ crystal 11) grown on the GaN substrate (base substrate 10) was sliced into pieces on planes parallel to the (0001) plane, and main planes of the pieces were polished, to thereby obtain five GaN crystal substrates ($Al_xGa_yIn_{1-x-y}N$ crystal substrate 12) each having a thickness of 0.5 mm. The five GaN crystal substrates obtained from the GaN crystal grown on base substrate I are referred to as a substrate I-a ($Al_xGa_yIn_{1-x-y}N$ crystal substrate 12a), a substrate I-b ($Al_xGa_yIn_{1-x-y}N$ crystal substrate 12b), a substrate I-c ($Al_xGa_yIn_{1-x-y}N$ crystal substrate 12c), a substrate I-d ($Al_xGa_yIn_{1-x-y}N$ crystal substrate 12d), and a substrate I-e ($Al_xGa_yIn_{1-x-y}N$ crystal substrate 12e), in the order closer to base substrate I. Similarly, the five GaN crystal substrates obtained from the GaN crystal grown on base substrate II are referred to as a substrate II-a, a substrate II-b, a substrate II-c, a substrate II-d, and a substrate II-e, in the order closer to base substrate II. The five GaN crystal substrates obtained from the GaN crystal grown on base substrate III are referred to as a substrate III-a, a substrate III-b, a substrate III-c, a substrate III-d, and a substrate III-e, in the order closer to base substrate III. The five GaN crystal substrates obtained from the GaN crystal grown on base substrate IV are referred to as a substrate IV-a, a substrate IV-b, a substrate IV-c, a substrate IV-d, and a substrate IV-e, in the order closer to base substrate IV. Specific resistance of these GaN crystal substrates was 0.03-0.08 Ω·cm by an eddy-current conductivity measurement.

Each of the GaN crystal substrates obtained as described above was etched with a KOH—NaOH mixed melt at a liquid temperature of 350° C., to form pits derived from various dislocations. The total number of pits per unit area was counted to thereby calculate the total dislocation density. In calculation of the total dislocation density, an area of the calculation region was adjusted such that 100-500 pits were observed in the calculation region, depending on the total dislocation density. Note that the maximum area of the calculation region was set to 1 $cm^2$. Furthermore, in calculation of the total dislocation density, a plurality of calculation regions were provided in the inner region of each of the substrates, and a mean value of total dislocation densities calculated from the plurality of calculation regions is shown in Table 1. The screw dislocation density was calculated in a manner similar to that of the calculation of the total dislocation density, except for that the screw dislocation density was calculated by counting the number of L pits per unit area. There existed a distribution of the total dislocation densities and a distribution of the screw dislocation densities in the inner region of the main plane. However, even in a part having the highest density, its density was at most two times as high as a mean value of each of the total dislocation densities and the screw dislocation densities.

TABLE 1

| | Dislocation Density of Substrate | | Properties of |
|---|---|---|---|
| Substrate | Total Dislocation Density ($cm^{-2}$) | Screw Dislocation Density ($cm^{-2}$) | Semiconductor Device Withstand Voltage (V) |
| I-a | 3200000 | 110000 | 360 |
| I-b | 1100000 | 56000 | 400 |
| I-c | 370000 | 28000 | 470 |
| I-d | 98000 | 28000 | 560 |
| I-e | 81000 | 12000 | 680 |
| II-a | 1300000 | 6200 | 450 |
| II-b | 350000 | 9800 | 680 |
| II-c | 3500 | 7300 | 840 |
| II-d | 2500 | 1200 | 880 |
| II-e | 2200 | 500 | 900 |
| III-a | 170000 | 200 | 750 |
| III-b | 2500 | 2700 | 860 |
| III-c | 1200 | 750 | 840 |
| III-d | 600 | 350 | 880 |
| III-e | 200 | 100 | 810 |
| IV-a | 41000 | 0 | 820 |
| IV-b | 500 | 120 | 800 |
| IV-c | 110 | 0 | 670 |
| IV-d | 52 | 0 | 250 |
| IV-e | 45 | 0 | 200 |

As is clear from Table 1, the total dislocation density and the screw dislocation density of a substrate tend to decrease as base substrate 10 used for crystal growth has larger inclined height H, and as the substrate is located farther from base substrate 10. In other words, it is possible to adjust the total dislocation density and the screw dislocation density in a crystal, by inclined height H of base substrate 10 and/or a thickness of the $Al_xGa_yIn_{1-x-y}N$ crystal to be grown.

Second Example

Each of the substrates etched in the first example was polished again, to thereby form GaN crystal substrates each having a diameter of 5.08 cm×a thickness of 400 μm (with specific resistance of 0.03-0.08 Ω·cm). With reference to FIG. 4, an n-type GaN layer (semiconductor layer 41) having a thickness of 15 μm and a carrier density of $1×10^{16}$ $cm^{-3}$ was then grown as a semiconductor layer by an MOCVD method on each of the substrates (Al$_x$Ga$_y$In$_{1-x-y}$N crystal substrate 12). Next, Schottky electrodes 42 each having a diameter of 450 μm and configured with an Au layer were formed on the n-type GaN layer (semiconductor layer 41) by a vacuum deposition method, at a pitch of 2 mm, and an ohmic electrode 43 configured with a layered body of a Ti layer and an Al layer was formed on the entire plane of each of the substrates (Al$_x$Ga$_y$In$_{1-x-y}$N crystal substrate 12) where the n-type GaN layer was not formed, and thus semiconductor devices 40 were obtained.

A voltage in an inverse direction was applied between Schottky electrodes 42 and ohmic electrode 43 of each semiconductor device 40 obtained, and a withstand voltage (a voltage that causes a phenomenon of a drastic increase in current in a reverse direction) of each semiconductor device 40 was measured. As to each of the semiconductor devices, the withstand voltage was measured at 19 points, and the mean value thereof was set as a withstand voltage of the semiconductor device. The results are compiled in Table 1. Furthermore, a relation between the total dislocation densities of the substrates in the semiconductor devices and withstand voltages of the semiconductor devices shown in Table 1 are compiled in FIG. 5.

Figure 5:
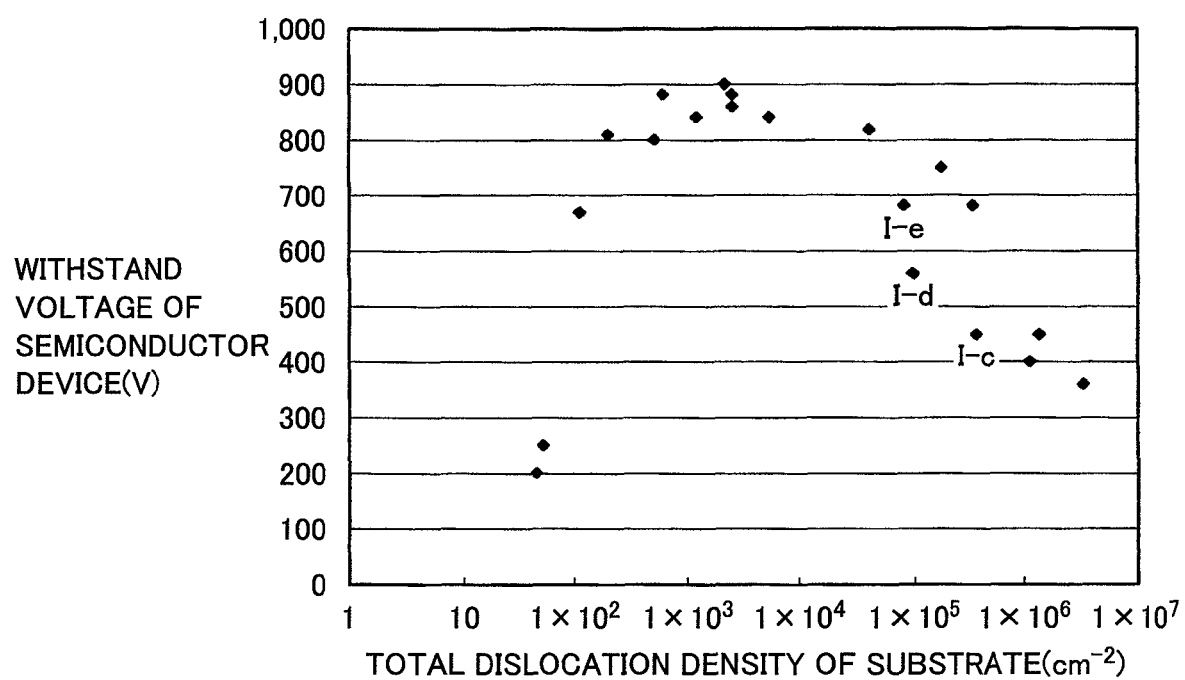
FIG. 5 is a diagram showing a relation between total dislocation densities of substrates in the semiconductor devices and withstand voltages of the semiconductor devices.

As is clear from Table 1 and FIG. 5, in the range of the total dislocation densities of the substrates in the semiconductor devices of at least $1\times10^2$ cm$^{-2}$ and at most $1\times10^6$ cm$^{-2}$, each of the semiconductor devices exhibited a high withstand voltage of at least 400 V. In other words, the withstand voltage of the semiconductor devices drastically decreased when the total dislocation densities of the substrates became lower than $1\times10^2$ cm$^{-2}$, or became higher than $1\times10^6$ cm$^{-2}$. Furthermore, in the range of the total dislocation density of the substrates in the semiconductor devices of at least $2\times10^2$ cm$^{-2}$ and at most $1\times10^5$ cm$^{-2}$, the withstand voltages of the semiconductor devices were stable at an extremely high level of 800-900 V. In other words, in the range of the total dislocation density of the substrates of at least $2\times10^2$ cm$^{-2}$ and at most $1\times10^5$ cm$^{-2}$, it was possible to obtain a semiconductor device having a uniform and high withstand voltage regardless of a value of the total dislocation density.

In FIG. 5, even in the range of the total dislocation density of the substrates in the semiconductor devices of at least $1\times10^2$ cm$^{-2}$ and at most $1\times10^6$ cm$^{-2}$, the semiconductor devices fabricated with the use of substrate I-c, substrate I-d, and substrate I-e, respectively, as substrates, exhibited low withstand voltages. The screw dislocation density of the substrates in such semiconductor devices exceeded $1\times10^4$ cm$^{-2}$. In other words, the screw dislocation density of a substrate is preferably at most $1\times10^4$ cm$^{-2}$ from a viewpoint of increasing a withstand voltage of the semiconductor device.

It should be understood that the embodiments and examples disclosed herein are illustrative and not limitative in all aspects. The scope of the present invention is shown not by the description above but by the scope of the claims, and is intended to include all modifications within the equivalent meaning and scope of the claims.

INDUSTRIAL APPLICABILITY

The Al$_x$Ga$_y$In$_{1-x-y}$N crystal substrate according to the present invention can preferably be used as a substrate for various devices such as light-emitting elements, electronic element, and semiconductor sensors.

The invention claimed is:

1. A GaN crystal substrate which has a main plane having an area of at least 10 cm$^2$, wherein
    said main plane has an outer region located within 5 mm from an outer periphery of said main plane, and an inner region corresponding to a region other than said outer region,
    said inner region has a total dislocation density of at least $1\times10^2$ cm$^{-2}$ and at most $1\times10^6$ cm$^{-2}$, and
    a screw dislocation density in said total dislocation density is at most $1\times10^4$ cm$^{-2}$.

2. The GaN crystal substrate according to claim 1, wherein said total dislocation density is at least $2\times10^2$ cm$^{-2}$ and at most $1\times10^5$ cm$^{-2}$.

3. The GaN crystal substrate according to claim 1, wherein said substrate has n-type conductivity and has specific resistance of at most 1 Ω·cm.

4. The GaN crystal substrate according to claim 1, wherein crystal growth of said substrate is performed by an HVPE method.

5. A semiconductor device comprising: an GaN crystal substrate; and an at least one-layered semiconductor layer formed on said GaN crystal substrate, wherein
    said substrate has a main plane having an area of at least 10 cm$^2$,
    said main plane has an outer region located within 5 mm from an outer periphery of said main plane, and an inner region corresponding to a region other than said outer region,
    said inner region has a total dislocation density of at least $1\times10^2$ cm$^{-2}$ and at most $1\times10^6$ cm$^{-2}$, and
    a screw dislocation density in said total dislocation density is at most $1\times10^4$ cm$^{-2}$.

6. The semiconductor device according to claim 5, wherein said total dislocation density is at least $2\times10^2$ cm$^{-2}$ and at most $1\times10^5$ cm$^{-2}$.

7. A method of manufacturing a semiconductor device, comprising the steps of: preparing a GaN crystal substrate; and growing an at least one-layered semiconductor layer on said substrate, wherein
    said substrate has a main plane having an area of at least 10 cm$^2$,
    said main plane has an outer region located within 5 mm from an outer periphery of said main plane, and an inner region corresponding to a region other than said outer region,
    said inner region has a total dislocation density of at least $1\times10^2$ cm$^{-2}$ and at most $1\times10^6$ cm$^{-2}$, and
    a screw dislocation density in said total dislocation density is at most $1\times10^4$ cm$^{-2}$.

8. The method of manufacturing the semiconductor device according to claim 7, wherein said total dislocation density is at least $2\times10^2$ cm$^{-2}$ and at most $1\times10^5$ cm$^{-2}$.

* * * * *